US007659549B2

(12) United States Patent
Lin et al.

(10) Patent No.: US 7,659,549 B2
(45) Date of Patent: Feb. 9, 2010

(54) METHOD FOR OBTAINING A BETTER COLOR RENDERING WITH A PHOTOLUMINESCENCE PLATE

(75) Inventors: Ray-Ming Lin, Tao-Yuan (TW); Jen-Chih Li, Sanchong (TW); Yung-Hsiang Lin, Taipei (TW); Yuan-Chieh Lu, Taoyuan (TW); Yi-Lun Chou, Taipei (TW)

(73) Assignee: Chang Gung University, Tao-Yuan (TW)

( * ) Notice: Subject to any disclaimer, the term of this patent is extended or adjusted under 35 U.S.C. 154(b) by 396 days.

(21) Appl. No.: 11/584,853

(22) Filed: Oct. 23, 2006

(65) Prior Publication Data

US 2008/0093615 A1 Apr. 24, 2008

(51) Int. Cl.
*H01L 33/00* (2006.01)

(52) U.S. Cl. ........................... 257/98; 257/99; 257/100; 257/E33.061

(58) Field of Classification Search ............ 257/98–100
See application file for complete search history.

(56) References Cited

U.S. PATENT DOCUMENTS 6,066,861 A * 5/2000 Hohn et al. ................... 257/99
2002/0043926 A1* 4/2002 Takahashi et al. ........... 313/503
2004/0026683 A1* 2/2004 Yamada et al. ................ 257/10
2004/0217364 A1* 11/2004 Tarsa et al. ..................... 257/89
2006/0044520 A1* 3/2006 Penn ........................... 353/31
2007/0159091 A1* 7/2007 Hirosaki et al. ............. 313/512
2009/0140630 A1* 6/2009 Kijima et al. ............... 313/498
2009/0236622 A1* 9/2009 Nishihara .................... 257/98
2009/0256166 A1* 10/2009 Koike et al. ................... 257/98

* cited by examiner

*Primary Examiner*—A. Sefer
(74) *Attorney, Agent, or Firm*—C. G. Mersereau; Nikolai & Mersereau, P.A.

(57) ABSTRACT

The present invention is a method for obtaining a better color rendering with a photoluminescence plate, and the better color rendering is obtained by using UV radiating on the photoluminescence plate stacked with a red photoluminescence plate, a green photoluminescence plate and a blue photoluminescence plate. Therefore, the color rendering is above 90% and close to the solar light. The photoluminescence plate can be made from directly coated with photoluminescence layers of three colors or with fully mixed fluorescent materials of three colors. Consequently, a white light relied on the present invention is more uniform than the conventional techniques with a color mixing performance based on tricolor LEDs.

4 Claims, 6 Drawing Sheets

METHOD FOR OBTAINING A BETTER COLOR RENDERING WITH A PHOTOLUMINESCENCE PLATE

BACKGROUND OF THE INVENTION

1. Field of the Invention

The present invention relates to a method for obtaining a better color rendering with a photoluminescence plate, and more particularly to a technique for performing good color rendering of white light, above 90% color rendering and well mixed light by irradiating the photoluminescence plate having three colors with ultraviolet (UV) ray.

2. Description of Related Art

Researches and reports point out that the power consumption on lighting will be saved half through using the solid-state illuminant because the solid state illuminant can convert electricity to light more effectively than the incandescent lamp and the fluorescent lamp. Light emitting diode (LED) is a kind of solid-state illuminant and has a history of more than 30 years, however it is used on the pilots of the small-scale of electronic equipments till now. How can we accomplish more energy saving and create more advantages on environment through using the high-efficient solid-state illuminant more widely? Many developing countries are still using the lighting systems based on fuel. Maybe they can jump over the lighting system with electrical-net and enter into the LED lighting era of white light with solar energy directly. Moreover, there are questions on cost, polluting, and lighting quality resulted from burning the kerosene or other fuel for lighting. It is really worth studying on using the solid-state illuminant because the solid-state illuminant can reduce the global lighting cost and decrease the release of the greenhouse gases.

In the conventional technique, the light emitting mechanism on the white LED is divided into two ways basically. One is the mainstream way on commercialization is based on Nichia's technique at present, that is coating a layer of yttrium-aluminum-garnet fluorescent material on the InGaN chip of a blue LED with 460 nm wavelength and irradiating the layer of yttrium-aluminum-garnet fluorescent material with the blue LED to produces a yellow light of 555 nm wavelength which is the complementary color of blue, and then the blue light and the yellow light are mixed to produce a macroscopic white light on the basis of the lens principle. However, the white light produced from such way lacks red in the spectrum and causes an object to perform yellowish-red as the red object was irradiated.

Another way of the light emitting mechanism on the white LED developed by Sumitomo Electric Industries is based on Zinc Selenide (ZnSe) material, but the luminescence efficiency is not good enough. Furthermore, Toyada Gosei cooperated with Toshiba to obtain the white light of good color rendering converted from the three kind of fluorescent materials irradiated with UV individually by using UV LED and three kinds of fluorescent materials through mixing three primary colors (R, G and B).

However, the encapsulation of the foregoing white LED is limited on the small-scale range of illumination device and results in the focus effect and worse light uniformity.

The conventional technique use a fluorescent material irradiated with a blue LED to produces a yellow light of 555 nm wavelength which is the complementary color of blue, then the blue light and the yellow light are mixed to produce a macroscopic white light on the basis of the lens principle. However; the white light produced from such way lacks red in the spectrum and causes an object to perform yellowish-red as the red object was irradiated.

In addition to, the white light has good color rendering converted from the three kind of fluorescent materials irradiated with UV individually by using UV LED and three kind of fluorescent materials through mixing three primary colors (R, G and B), but there is the problem on color unevenness.

Therefore, the present invention provides a method for obtaining better color rendering to obviate the disadvantages of the conventional techniques.

SUMMARY OF THE INVENTION

The main objective of the present invention is to provide a method for obtaining better color rendering with a photoluminescence plate.

According the present invention, an illumination device is a UV LED which is coupled with a power and a tricolor photoluminescence plate is disposed on the radiation path of the UV LED, wherein the tricolor photoluminescence plate maybe three monochrome photoluminescence plates, one photoluminescence plate having three photoluminescence layers or one photoluminescence plate with a mix of three colors. In accordance with the present invention, a light emitted from the UV LED passes through the tricolor photoluminescence plate and is converted to a white light with a color rendering above 90%. The white light very approaches 100% broadband spectrum of the solar light, and the white light is more uniform and more efficient. Furthermore, the present invention is no focus effect and has better uniform because the tricolor photoluminescence plate is disposed on the outside of the illumination device.

Compared with the conventional techniques, the present invention has the benefits, as below:

A. The white light produced by using a fluorescent material irradiated with the blue LED radiates on a red object to appear yellowish-red in the conventional technique, but the white light relied on the present invention through exciting the photoluminescence plate with UV is above 90% color rendering, very close to the real white light and more comfortable on vision feeling.

B. The white light produced by mixing three primary colors is worse efficient and results in uneven color in the conventional technique, but the present invention by radiating the tricolor photoluminescence plate with UV for appearing the white light through the photoluminescence plate make the color rendering of white light close to the solar light and get the uniform color.

C. In general, the encapsulation of the white LED is merely limited within the range of smaller encapsulation and results in the focus effect in the conventional technique, but the photoluminescence plate relied on the present invention is disposed on the outside of the LED encapsulation and makes the more uniform light passed through the photoluminescence plate.

Further benefits and advantages of the present invention will become apparent after a careful reading of the detailed description with appropriate reference to the accompanying drawings.

DETAILED DESCRIPTION OF THE INVENTION

Figure 1:
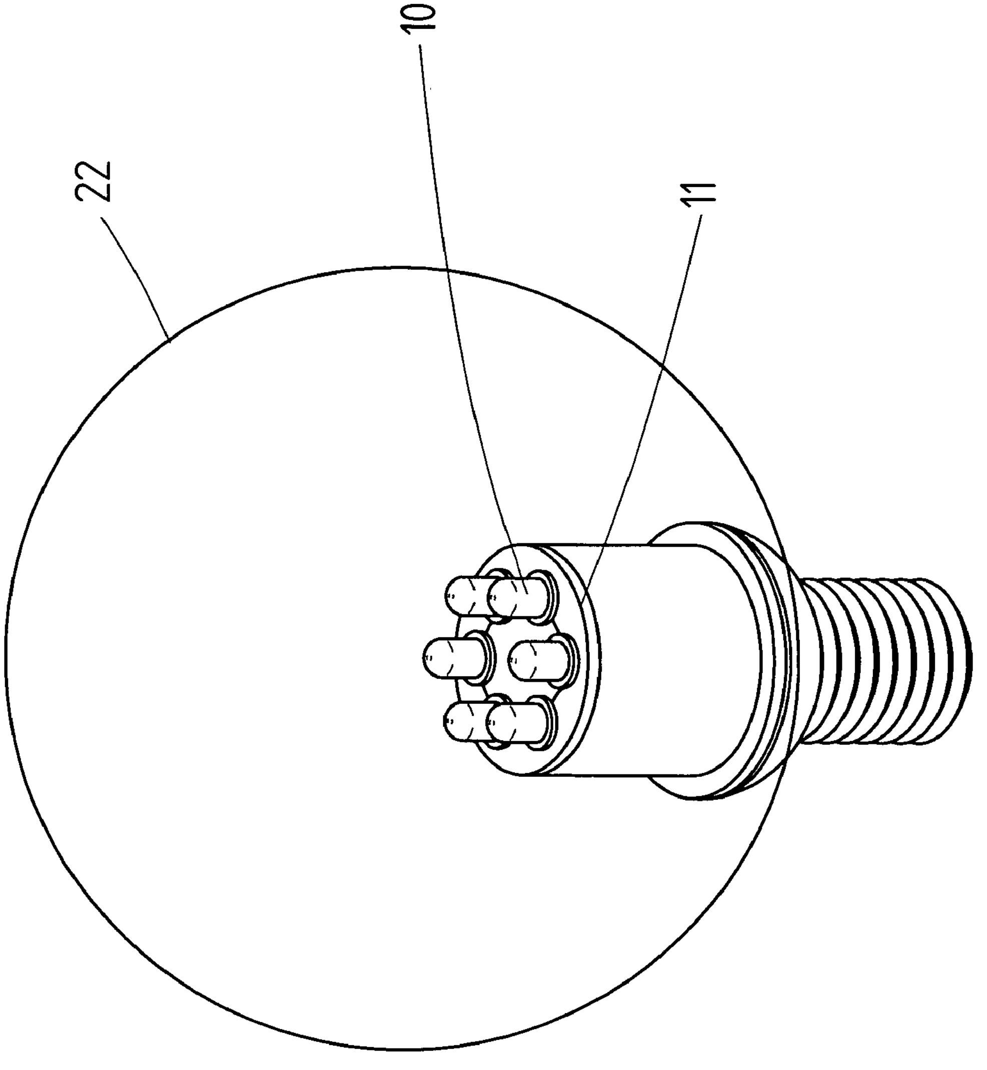
FIG. 1 shows a cubic view according an embodiment of the present invention.
Figure 2:
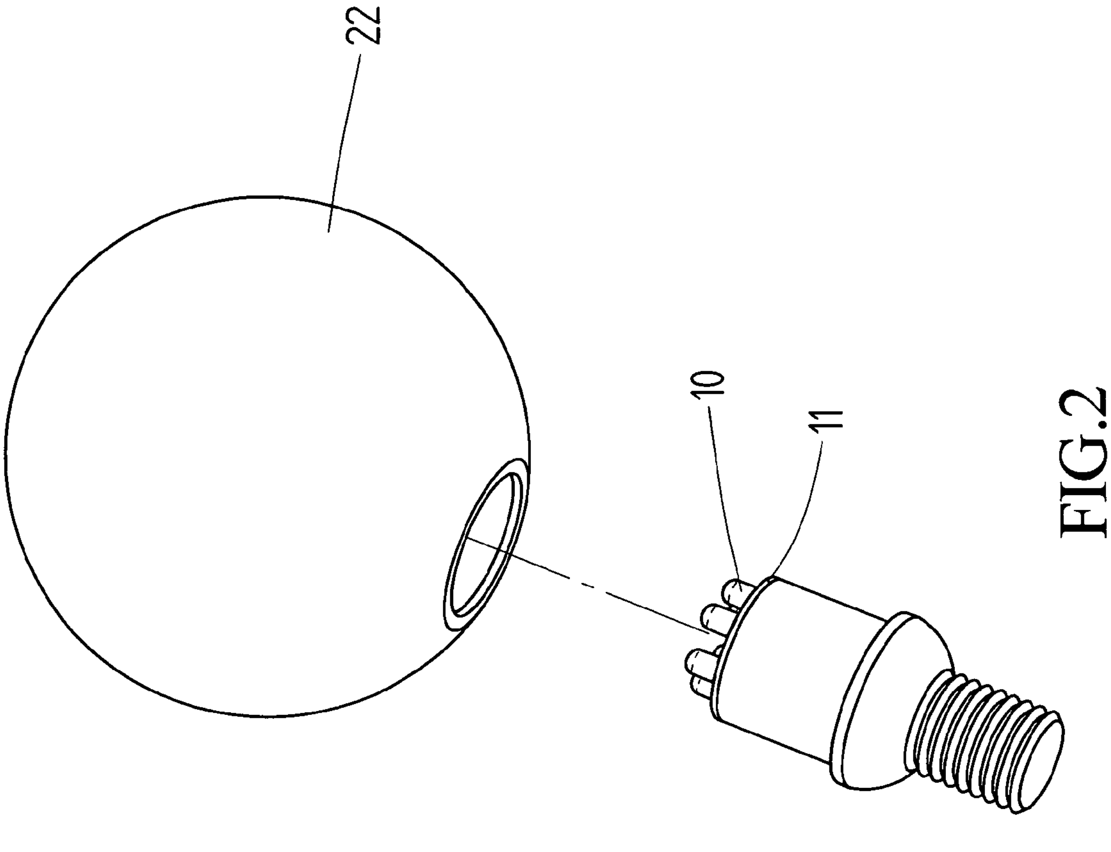
FIG. 2 shows an exploring view of the embodiment shown in FIG. 1.
Figure 3:
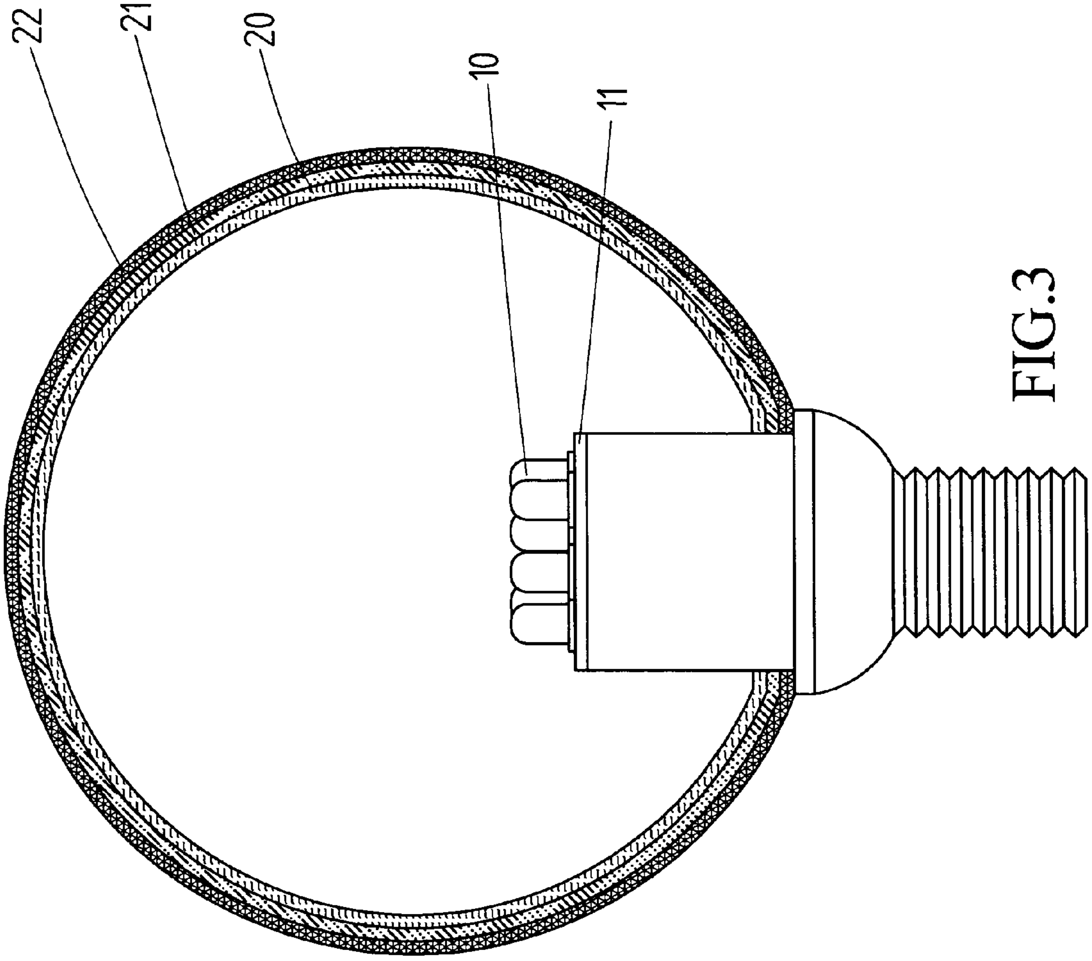
FIG. 3 shows a cross-sectional view of the embodiment shown in FIG. 1.

Referring to FIG. 1 to FIG. 3 according an embodiment of the present invention, an illumination device 10 is a UV LED that is fixed on a circuit board 11 (as shown in FIG. 1 to FIG. 3) and coupled with the circuit board 11. There are three photoluminescence plates 20, 21 and 22 (as shown in FIG. 3) disposed on the radiation path of the UV LED, and a red photoluminescence plate 20, a green photoluminescence plate 21 and a blue photoluminescence plate 22 are disposed in irradiated order. Accordingly, the light radiating form the illumination device 10 passes through three photoluminescence plates 20, 21 and 22 to appear a white light, and a color rendering above 90% is reached. The better is the color rendering, the closer to the solar light. The whole light is stable enough as the efficiency of UV is better.

Therefore, the present invention provides a method for obtaining a better color rendering with a photoluminescence plate according the embodiment, comprising the steps of:

(a) disposing a tricolor photoluminescence plate on the radiation path of an UV illumination device; and (b) coupling the UV illumination device with a power, such that a light radiating from the UV illumination device passes through the tricolor photoluminescence plate to excite the tricolor photoluminescence plate and radiate a white light.

Figure 4:
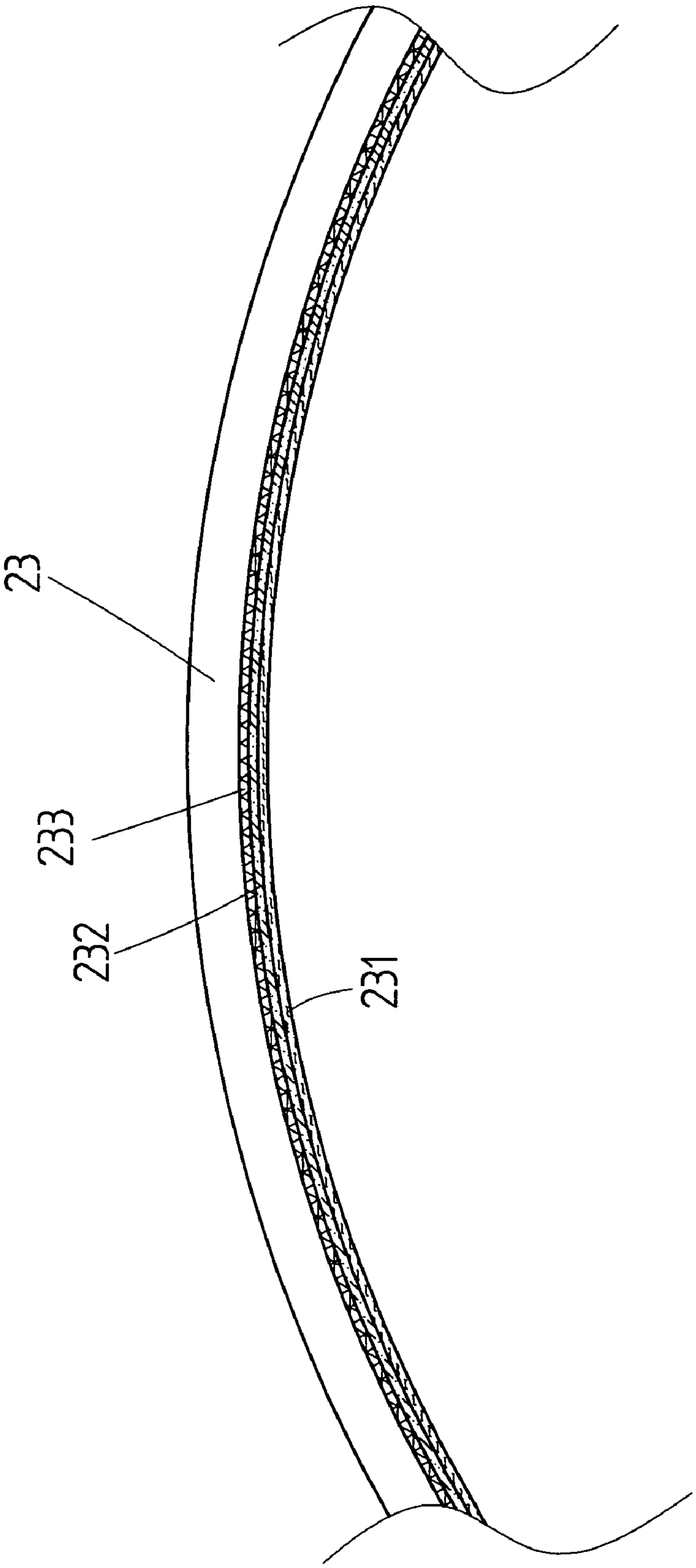
FIG. 4 shows a cross-sectional view according another embodiment of the present invention.

Referring to FIG. 3 and FIG. 4 according another embodiment of the present invention, the photoluminescence plate 23 is made in a structure of three layers. The photoluminescence plate 23 has three photoluminescence layers 231, 232 and 233 disposed on the radiation path of the UV illumination device 10 in irradiated order, and therefore the first is a red photoluminescence layer 231, the next is a green photoluminescence layer 232 and the last is a blue photoluminescence layer 233. The UV illumination device 10 (as shown in FIG. 3) illuminates on three photoluminescence layers 231, 232 and 233, and excites three photoluminescence layers 231, 232 and 233 individually to radiate a white light.

Figure 5:
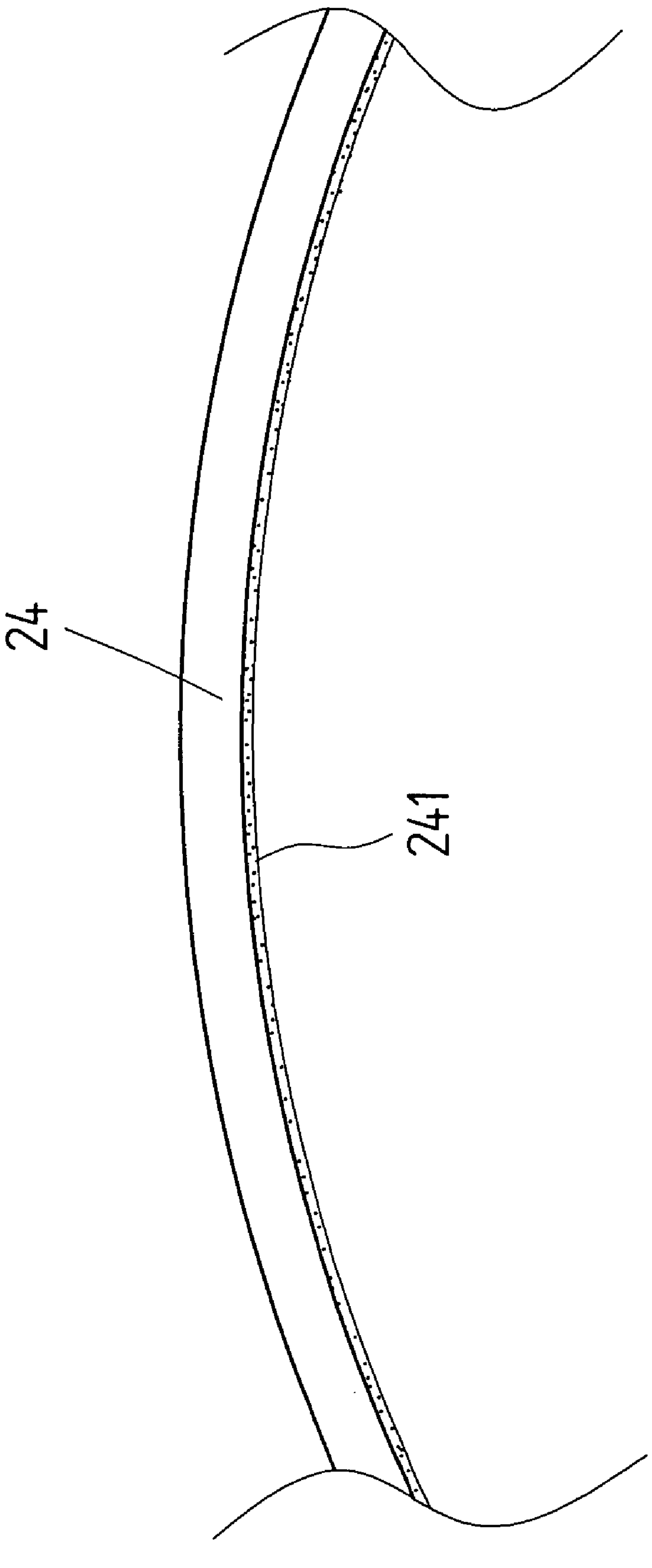
FIG. 5 shows a cross-sectional view according another embodiment of the present invention.

Referring to FIG. 3 and FIG. 5 according another embodiment of the present invention, the photoluminescence plate 24 is made in a structure of one piece. A photoluminescence layer 241 made of fully mixed fluorescent materials with three colors is disposed on the photoluminescence plate 24, and therefore the UV illumination device 10 illuminates on the photoluminescence layer 241 (as shown in FIG. 5) to excite the fluorescent materials and then radiates a white light with the color mixing performance.

Figure 6:
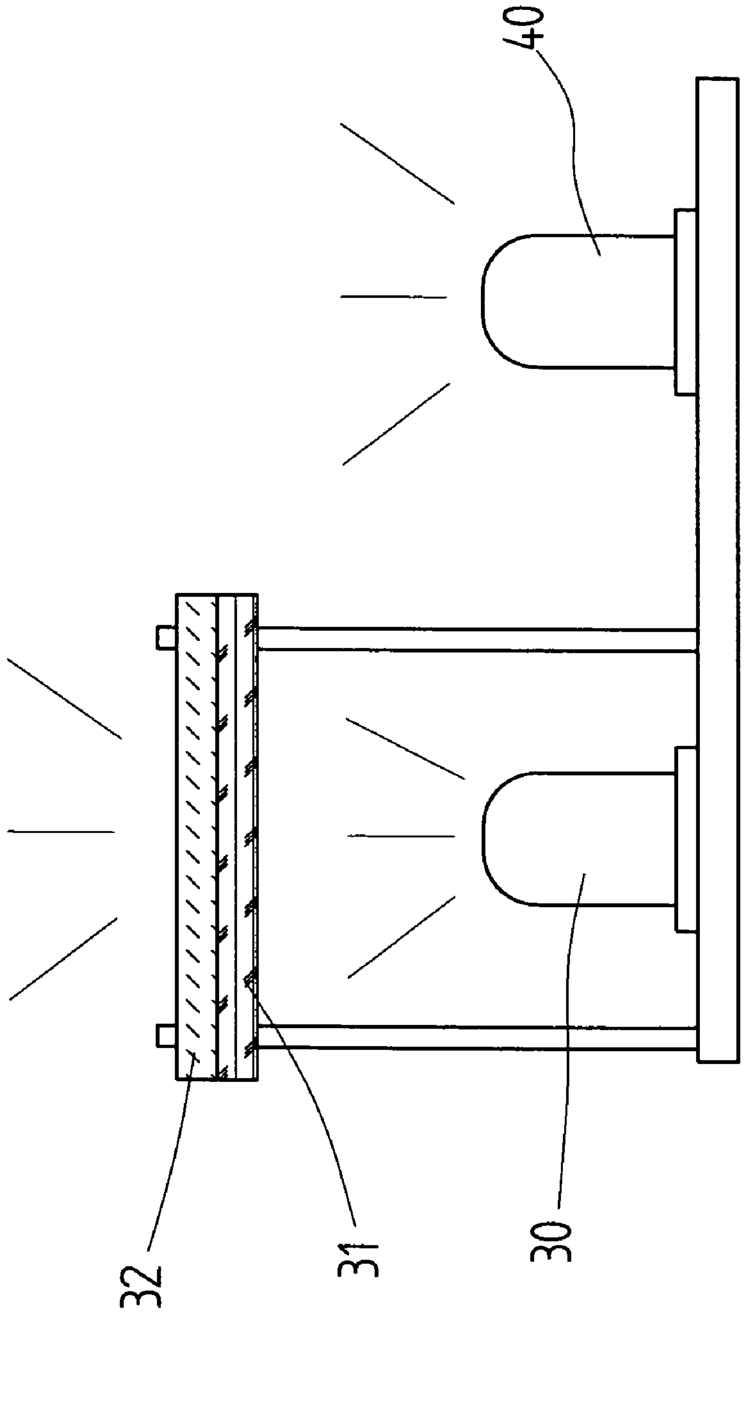
FIG. 6 shows a cross-sectional view according another embodiment of the present invention.

Referring to FIG. 6 according another embodiment of the present invention, an illumination device comprises a blue LED illumination device 30 and red LED illumination devices 40, and there are two photoluminescence plates 31 and 32 disposed on the outside of the blue LED illumination device 30. The photoluminescence plates 31 near to the blue LED illumination device 30 is a cyan photoluminescence plate and the photoluminescence plates 32 far away from the blue LED illumination device 30 is a green photoluminescence plate. The blue LED illumination device 30 excites the cyan photoluminescence plate 31 and the green photoluminescence plate 32 to produce a colorful light, and then the colorful light is mixed with a red light radiated from the red LED illumination devices 40 to appear a white light. The color rendering of the white light can reaches above 90%.

As foregoing description, the present invention provides a method for obtaining a better color rendering with a photoluminescence plate, comprising the steps of:

(a) disposing two illumination devices, wherein one is a blue illumination device and the other is a red illumination device near to the blue illumination device;

(b) disposing a bicolor photoluminescence plate on the radiation path of the blue illumination device, wherein the bicolor is cyan and green; and (c) coupling the blue illumination device and the red illumination device with a power, such that a blue light radiated from the blue illumination device passes through the bicolor photoluminescence plate to excite the bicolor photoluminescence plate and produce a colorful light, and then the colorful light is mixed with a red light radiated from the red LED illumination devices to appear a white light.

In addition to, the present invention provides another method for obtaining a better color rendering with a photoluminescence plate, comprising the steps of:

(a) disposing two illumination devices, wherein one is a blue illumination device and the other is a red illumination device near to the blue illumination device;

(b) disposing a monochrome photoluminescence plate on the radiation path of the blue illumination device, wherein the monochrome is green; and (c) coupling the blue illumination device and the red illumination device with a power, such that a blue light radiated from the blue illumination device passes through the monochrome photoluminescence plate to excite the bicolor photoluminescence plate and produce a colorful light, and then the colorful light is mixed with a red light radiated from the red LED illumination devices to appear a white light.

Although the present invention has been explained in relation to its preferred embodiments, it is to be understood that many other possible modifications and variations can be made without departing from the spirit and scope of the invention as hereinafter claimed.

What is claimed is:

1. A method for obtaining improved color rendering using a photoluminescence plate, comprising the steps of:

(a) disposing two illumination devices, wherein one is a blue LED illumination device and the other is a red LED illumination device near to the blue LED illumination device;

(b) disposing a bicolor photoluminescence plate on the radiation path of the blue LED illumination device, wherein the bicolor is cyan and green; and (c) coupling the blue LED illumination device and the red LED illumination device with a power source, such that blue light radiated from the blue LED illumination device passes through the bicolor photoluminescence plate to excite the bicolor photoluminescence plate and produce a colorful light, and then the colorful light is mixed with red light radiated from the red LED illumination device to appear as a white light.

2. The method as claimed in claim 1, wherein the bicolor photoluminescence plate is stacked with a cyan photoluminescence plate and a green photoluminescence plate in order.

3. The method as claimed in claim 1, wherein the bicolor photoluminescence plate is disposed with a cyan photoluminescence layer and a green photoluminescence layer in order.

4. The method as claimed in claim 1, wherein the bicolor photoluminescence plate is made of fully mixed fluorescent materials with two colors such as cyan and green.

* * * * *